United States Patent
Chen et al.

(10) Patent No.: US 12,382,628 B2
(45) Date of Patent: Aug. 5, 2025

(54) SEMICONDUCTOR DEVICE AND METHOD FOR FORMING THE SAME

(71) Applicant: YANGTZE MEMORY TECHNOLOGIES CO., LTD., Wuhan (CN)

(72) Inventors: Liang Chen, Wuhan (CN); Wenshan Xu, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 535 days.

(21) Appl. No.: 17/534,939

(22) Filed: Nov. 24, 2021

(65) Prior Publication Data

US 2023/0134829 A1    May 4, 2023

Related U.S. Application Data

(63) Continuation of application No. PCT/CN2021/127465, filed on Oct. 29, 2021.

(51) Int. Cl.
*H10B 20/00* (2023.01)
*H01L 21/265* (2006.01)
(Continued)

(52) U.S. Cl.
CPC ....... *H10B 20/60* (2023.02); *H01L 21/26513* (2013.01); *H10D 62/83* (2025.01); *H10D 64/01* (2025.01); *H10D 64/62* (2025.01)

(58) Field of Classification Search
CPC ........ H10B 20/60; H10B 43/27; H10B 43/40; H10B 41/35; H10B 41/20; H10B 43/20;
(Continued)

(56) References Cited

U.S. PATENT DOCUMENTS 6,069,398 A * 5/2000 Kadosh ............... H01L 27/0688
257/536
9,882,066 B1 * 1/2018 Marino .................... H10D 1/64
(Continued)

FOREIGN PATENT DOCUMENTS

CN    101872784 A    10/2010
CN    102074479 A    5/2011
(Continued)

OTHER PUBLICATIONS

International Search Report issued in corresponding International Application No. PCT/CN2021/127465, mailed Jul. 27, 2022, 4 pages.

*Primary Examiner* — Steven B Gauthier
*Assistant Examiner* — Khatib A Rahman
(74) *Attorney, Agent, or Firm* — BAYES PLLC

(57) ABSTRACT

A semiconductor device includes a semiconductor substrate, a doped region formed in the semiconductor substrate, a source/drain formed in the doped region, a conductive pad formed on the source/drain, a gate dielectric layer disposed over the semiconductor substrate and the doped region exposing the conductive pad, a gate formed on the gate dielectric layer, an insulation layer formed over the gate, the gate dielectric layer, and the conductive pad, and a contact formed in the insulation layer in electric contact with the conductive pad.

14 Claims, 14 Drawing Sheets

(51) Int. Cl.
    *H10D 62/83*     (2025.01)
    *H10D 64/01*     (2025.01)
    *H10D 64/62*     (2025.01)

(58) Field of Classification Search
    CPC . H10B 43/35; H01L 21/26513; H01L 29/401; H01L 29/456; H01L 21/76897; H01L 23/485; H01L 21/28518; H01L 29/66568; H01L 29/7833; H10D 62/83; H10D 64/01; H10D 64/62; H10D 64/021; H10D 30/027; H10D 30/601; H10F 77/215
    See application file for complete search history.

(56) References Cited

U.S. PATENT DOCUMENTS 12,176,290 B2 * 12/2024 Choi .................. H01L 23/5226
2012/0261725 A1 * 10/2012 Flachowsky ........ H01L 29/6659
    257/E21.334
2013/0056804 A1 * 3/2013 Moriyama ........ H01L 21/76224
    257/288
2014/0065819 A1 * 3/2014 Ahmed ............. H01L 21/28556
    257/E21.296
2014/0131796 A1 * 5/2014 Zhou .................. H01L 29/1083
    438/286
2020/0258909 A1 * 8/2020 Amano .................. H10B 43/27

FOREIGN PATENT DOCUMENTS

| | | |
|---|---|---|
| CN | 106158755 A | 11/2016 |
| CN | 108155237 A | 6/2018 |
| CN | 109671779 A | 4/2019 |
| CN | 109755254 A | 5/2019 |
| CN | 110034189 A | 7/2019 |

* cited by examiner

SEMICONDUCTOR DEVICE AND METHOD FOR FORMING THE SAME

CROSS-REFERENCES TO RELATED APPLICATIONS

This application is continuation of International Application No. PCT/CN2021/127465, filed on Oct. 29, 2021, entitled "SEMICONDUCTOR DEVICE AND METHOD FOR FORMING THE SAME," which is hereby incorporated by reference in its entirety.

BACKGROUND

The present disclosure relates to semiconductor devices and methods for forming the semiconductor devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A 3D memory device architecture can address the density limitation in some planar semiconductor devices, for example, Flash memory devices.

A 3D memory device can be formed by stacking semiconductor wafers or dies and interconnecting them vertically so that the resulting structure acts as a single device to achieve performance improvements at reduced power and a smaller footprint than conventional planar processes. The 3D memory architecture includes a memory array and peripheral circuits for facilitating operations of the memory array.

SUMMARY

In one aspect, a semiconductor device is disclosed. The semiconductor device includes a semiconductor substrate, a doped region formed in the semiconductor substrate, a source/drain formed in the doped region, a conductive pad formed on the source/drain, a gate dielectric layer disposed over the semiconductor substrate and the doped region exposing the conductive pad, a gate formed on the gate dielectric layer, an insulation layer formed over the gate, the gate dielectric layer, and the conductive pad, and a contact formed in the insulation layer in electric contact with the conductive pad.

In another aspect, a 3D memory device is disclosed. The 3D memory device includes a peripheral device and a memory stack disposed above the peripheral device. The peripheral device includes a plurality of transistors. Each transistor includes a semiconductor substrate, a doped region formed in the semiconductor substrate, a source/drain formed in the doped region, a conductive pad formed on the source/drain, a gate dielectric layer disposed over the semiconductor substrate and the doped region exposing the conductive pad, a gate formed on the gate dielectric layer, an insulation layer formed over the gate, the gate dielectric layer, and the conductive pad, and a contact formed in the insulation layer in electric contact with the conductive pad.

In still another aspect, a system is disclosed. The system includes a 3D memory device configured to store data, and a memory controller coupled to the 3D memory device and is configured to control operations of the 3D memory device. The 3D memory device includes a peripheral device and a memory stack disposed above the peripheral device. The peripheral device includes a plurality of transistors. Each transistor includes a semiconductor substrate, a doped region formed in the semiconductor substrate, a source/drain formed in the doped region, a conductive pad formed on the source/drain, a gate dielectric layer disposed over the semiconductor substrate and the doped region exposing the conductive pad, a gate formed on the gate dielectric layer, an insulation layer formed over the gate, the gate dielectric layer, and the conductive pad, and a contact formed in the insulation layer in electric contact with the conductive pad.

In yet another aspect, a method for forming a semiconductor device is disclosed. A semiconductor substrate having a dielectric layer formed over the semiconductor substrate is provided. A first opening and a second opening are formed in the dielectric layer exposing the semiconductor substrate. A gate structure is formed on the dielectric layer between the first opening and the second opening. A first implantation operation is performed to form a doped region in the semiconductor substrate. A second implantation operation is performed to form a source/drain in the doped region. A conductive pad is formed on the source/drain in the first opening and the second opening. An insulation layer is formed over the gate structure, the dielectric layer, and the conductive pad. A contact is formed in the insulation layer in electric contact with the conductive pad.

In yet another aspect, a method for forming a 3D memory device is disclosed. A peripheral device is formed on a semiconductor substrate. The formation of the peripheral device includes forming a dielectric layer over the semiconductor substrate, forming a first opening and a second opening in the dielectric layer exposing the semiconductor substrate, forming a gate structure on the dielectric layer between the first opening and the second opening, performing a first implantation operation to form a doped region in the semiconductor substrate, performing a second implantation operation to form a source/drain in the doped region, forming a conductive pad on the source/drain in the first opening and the second opening, forming an insulation layer over the gate structure, the dielectric layer, and the conductive pad, and forming a contact in the insulation layer in electric contact with the conductive pad. A memory stack is formed on the peripheral device.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
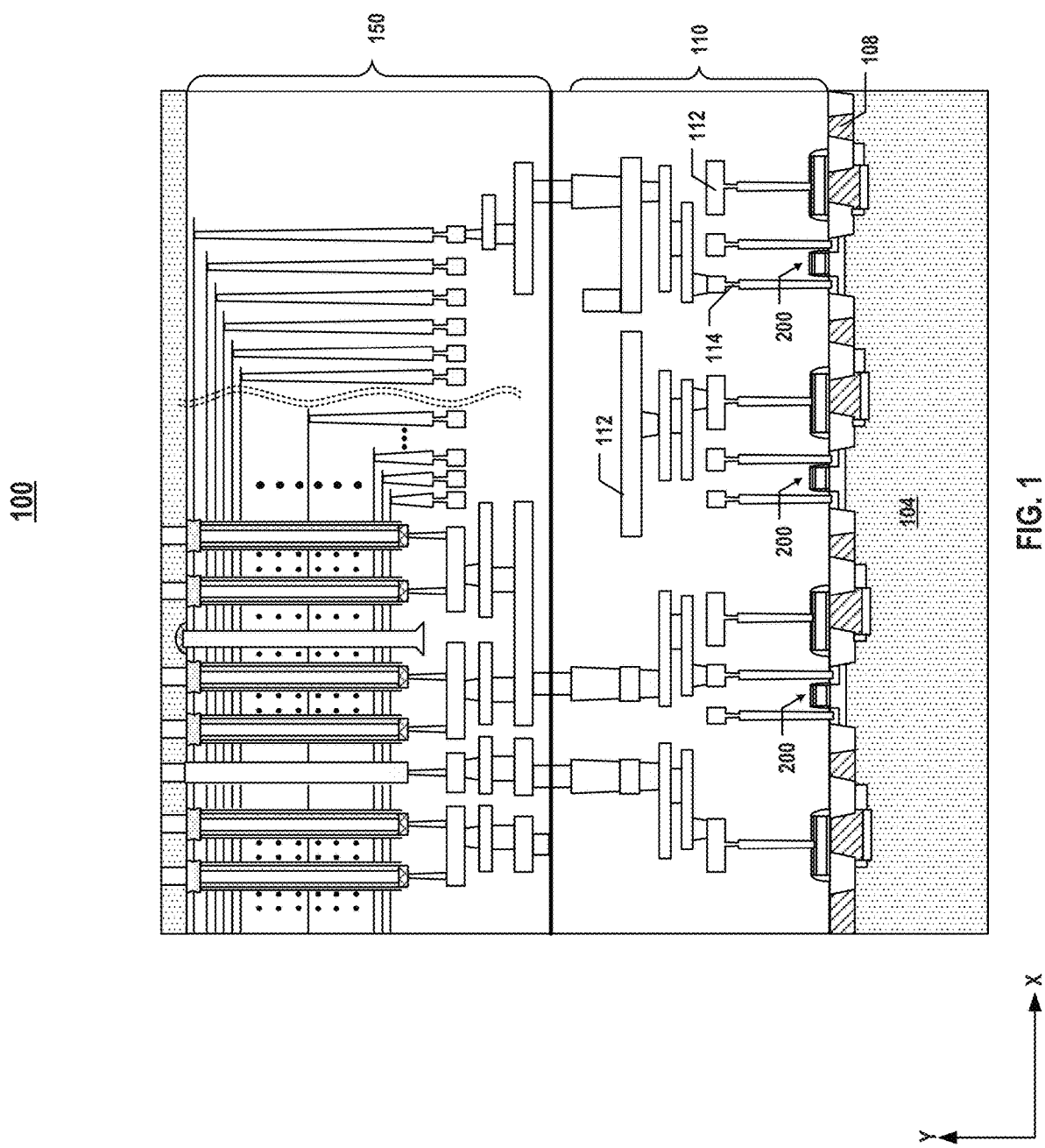
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Compared with logic devices, such as microprocessors, the complementary metal-oxide semiconductor (CMOS) technology nodes used for peripheral circuits of memory devices, such as NAND Flash memory, are less advanced (e.g., 60 nm and above) because the memory peripheral circuits require low cost and low leakage current (a.k.a. off-state current $T_{off}$). With the development of 3D memory devices, such as 3D NAND Flash memory devices, the more stacked layers (e.g., word lines) require more peripheral circuits for operating the 3D memory devices, thereby demanding a smaller unit size of the peripheral circuit. For example, the number and/or size of page buffers needs to increase to match the increased number of memory cells. In some cases, the chip area occupied by page buffers can become dominating in a 3D NAND Flash memory, for example, more than 50% of the total chip area. In another example, the number of string drivers in the word line driver is proportional to the number of word lines in the 3D NAND Flash memory. Thus, the continuous increase of the word lines also increases the area occupied by the word line driver, as well as the complexity of metal routings, sometimes even the number of metal layers. Moreover, in some 3D memory devices in which the memory cell array and peripheral circuits are fabricated on different substrates and bonded together, the continuous increase of peripheral circuit areas, particularly page buffer area, makes it the bottleneck for reducing the total chip size.

However, scaling down the peripheral circuit size following the advanced technology node trend used for the logic devices would cause a significant cost increase and higher leakage current, which are undesirable for memory devices. Moreover, because the 3D NAND Flash memory devices require a relatively high voltage (e.g., above 5 V) in certain memory operations, such as program and erase, unlike logic devices, which can reduce its working voltage as the CMOS technology node advances, the voltage provided to the memory peripheral circuits cannot be reduced. For maintaining the low contact resistance of the high voltage devices, a metal silicide layer may be formed between the source/drain regions and the contact structures. The present disclosure introduces a transistor structure having the metal silicide layer between the source/drain regions and the contact structures without using a metal silicide blocking layer during the fabrication. Hence, the manufacturing process and the fabricating cost may be further improved.

FIG. 1 illustrates a cross-section of an exemplary 3D memory device 100, according to some aspects of the present disclosure. 3D memory device 100 represents an example of a non-monolithic 3D memory device. The term "non-monolithic" means that the components of 3D memory device 100 (e.g., the peripheral devices and the memory array) can be formed separately on different substrates and then joined to form a 3D memory device. It is understood that the non-monolithic 3D memory device shown in FIG. 1 is for illustrative only, and not for limiting. For example, the peripheral devices and the memory array may be formed aside.

3D memory device 100 may include a substrate 104, which can include silicon (e.g., single crystalline silicon), silicon germanium (SiGe), gallium arsenide (GaAs), germanium (Ge), silicon on insulator (SOI), or any other suitable materials. 3D memory device 100 may have a peripheral device formed on substrate 104. The peripheral device can be formed "on" substrate 104, in which the entirety or part of the peripheral device is formed in substrate 104 (e.g., below the top surface of substrate 104) and/or directly on substrate 104. The peripheral device can include a plurality of transistors 200 formed on substrate 104. Isolation regions 108 (e.g., shallow trench isolations (STIs)) and doped regions (e.g., source regions and drain regions of transistors 200) can be formed in substrate 104 as well.

In some embodiments, the peripheral device can include any suitable digital, analog, and/or mixed-signal peripheral circuits used for facilitating the operation of 3D memory device 100. For example, the peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on substrate 104 using complementary metal-oxide-semiconductor (CMOS) technology (also known as a "CMOS chip").

3D memory device 100 may include an interconnect layer 110 above transistors 200 (referred to herein as a "peripheral interconnect layer") to transfer electrical signals to and from transistors 200. Peripheral interconnect layer 110 can include a plurality of interconnects (also referred to herein as "contacts"), including lateral interconnect lines 112 and vertical interconnect access (via) contacts 114. As used herein, the term "interconnects" can broadly include any suitable types of interconnects, such as middle-end-of-line (MEOL) interconnects and back-end-of-line (BEOL) interconnects. Peripheral interconnect layer 110 can further include one or more interlayer dielectric (ILD) layers (also known as "intermetal dielectric (IMD) layers") in which interconnect lines 112 and via contacts 114 can form. That is, peripheral interconnect layer 110 can include interconnect lines 112 and via contacts 114 in multiple ILD layers. Interconnect lines 112 and via contacts 114 in peripheral interconnect layer 110 can include conductive materials including, but not limited to, tungsten (W), cobalt (Co), copper (Cu), aluminum (Al), silicide, or any combination thereof. The ILD layers in peripheral interconnect layer 110 can include dielectric materials including, but not limited to, silicon oxide, silicon nitride, silicon oxynitride, low dielectric constant (low-k) dielectrics, or any combination thereof.

3D memory device 100 may include a memory array device 150 above the peripheral device. It is noted that x and y axes are added in FIG. 1 to further illustrate the spatial relationship of the components in 3D memory device 100. Substrate 104 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 104) in the y-direction (the vertical direction or thickness direction) when the substrate is positioned in the lowest plane of the semiconductor device in the y-direction. The same notion for describing spatial relationship is applied throughout the present disclosure.

In some embodiments, 3D memory device 100 is a NAND Flash memory device in which memory cells are provided in the form of an array of NAND memory strings each extending vertically above the peripheral device (e.g., transistors 200) and substrate 104. Memory array device 150 may include NAND memory strings that extend vertically through a plurality of pairs each including a conductor layer and a dielectric layer (referred to herein as "conductor/dielectric layer pairs").

Figure 2:
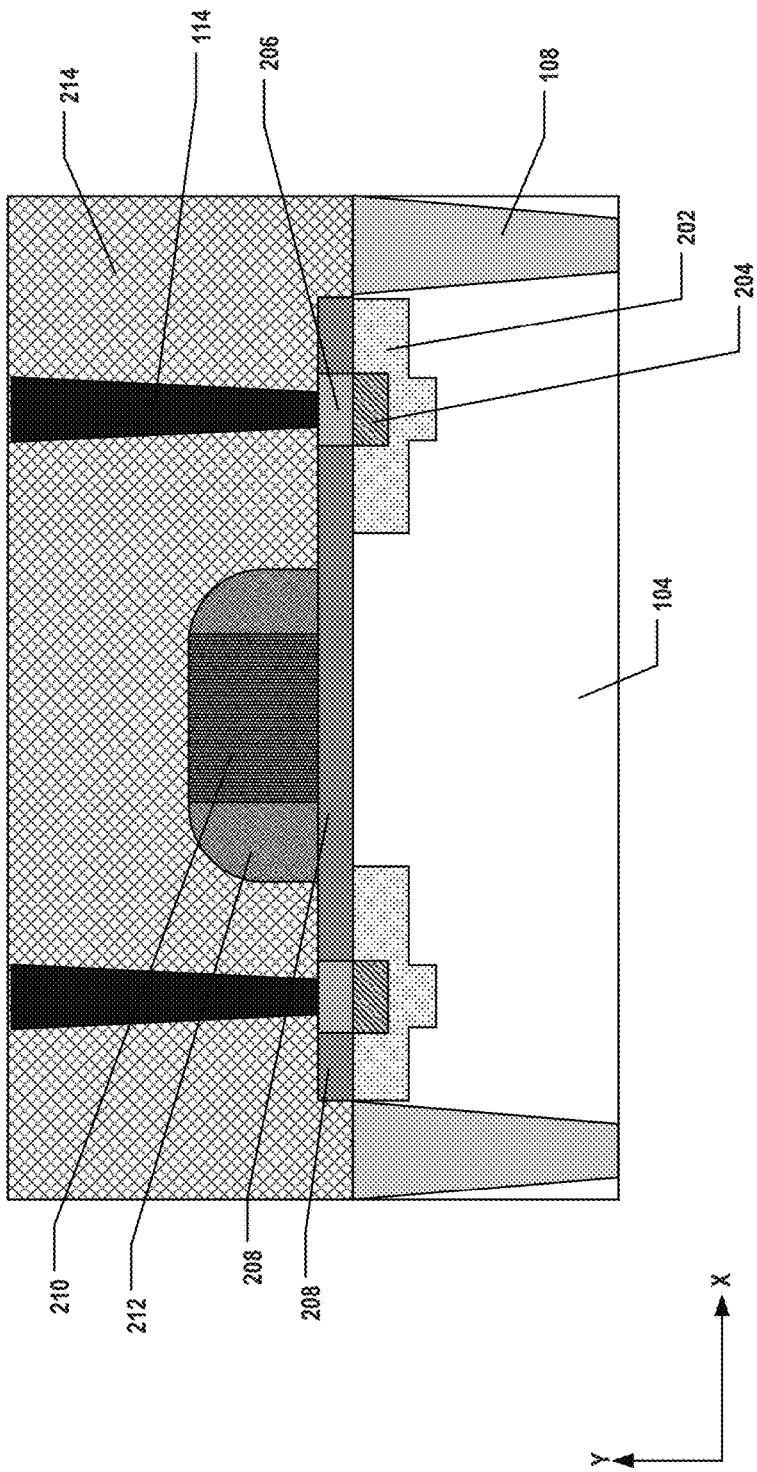
FIG. 2 illustrates a cross-section of an exemplary transistor, according to some aspects of the present disclosure.

FIG. 2 illustrates a cross-section of transistor 200, according to some aspects of the present disclosure. Transistor 200 includes substrate 104, a doped region 202, a source/drain 204, a conductive pad 206, a gate dielectric layer 208, a gate 210, an insulation layer 214, and via contacts 114. Doped region 202 is formed in substrate 104, source/drain 204 is formed in doped region 202, and conductive pad 206 is formed on source/drain 204.

Gate dielectric layer 208 is disposed over substrate 104 and doped region 202 exposing conductive pad 206. In other words, gate dielectric layer 208 is not formed only beneath gate 210, but also covers portions of substrate 104 and doped region 202. Furthermore, as shown in FIG. 2, conductive pad 206 is formed on source/drain 204 surrounded by gate dielectric layer 208. In other words, conductive pad 206 is in contact with gate dielectric layer 208. In some implementations, conductive pad 206 is in direct contact with gate dielectric layer 208. Gate 210 is formed on gate dielectric layer 208, and a spacer 212 is formed on the side of gate 210. Insulation layer 214 may be a portion of the one or more ILD layers of peripheral interconnect layer 110. Insulation layer 214 may cover gate 210, spacer 212, gate dielectric layer 208, and portions of conductive pad 206. Via contact 114 is formed in insulation layer 214 in electric contact with conductive pad 206.

In some implementations, transistor 200 may have an operation voltage higher than 2.5V, for example, 3.3V or 5V, etc. Transistor 200 may be a high-voltage NMOS transistor or a high-voltage PMOS transistor, and each transistor 200 is isolated through isolation regions 108, for example, an STI structure. For example, source/drain 204 of the high voltage NMOS transistor or the high-voltage PMOS transistor may be formed in substrate 104, and doped region 202, e.g., a lightly doped region, or a shallow lightly doped region, may be further formed in substrate 104 around source/drain 204 of the high voltage NMOS transistor or the high-voltage PMOS transistor.

In some implementations, transistor 200 further includes a gate structure on the top surface of substrate 104. The gate structure may include gate dielectric layer 208 and gate 210. In some implementations, gate dielectric layer 208 is formed over substrate 104 and doped region 202. In some implementations, gate dielectric layer 208 may be further formed over isolation regions 108. In some implementations, gate dielectric layer 208 may include any suitable dielectric materials, such as silicon oxide, silicon nitride, silicon oxynitride, or high-k dielectrics. In some implementations, gate dielectric layer 208 includes silicon oxide, i.e., a gate oxide. Gate 210 is formed on gate dielectric layer 208, and in direct contact with gate dielectric layer 208. In some implementations, gate 210 may include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, gate 210 includes doped polysilicon, i.e., a gate poly.

In some implementations, conductive pad 206 is formed on source/drain 204 surrounded by gate dielectric layer 208. In some implementations, conductive pad 206 may include any suitable metal silicide materials, such as WSix, CoSix, NiSix, AlSix, etc., or any combination thereof. In some implementations, conductive pad 206 may include a metal silicide layer. In some implementations, conductive pad 206 may include nickel silicide.

Figure 3:
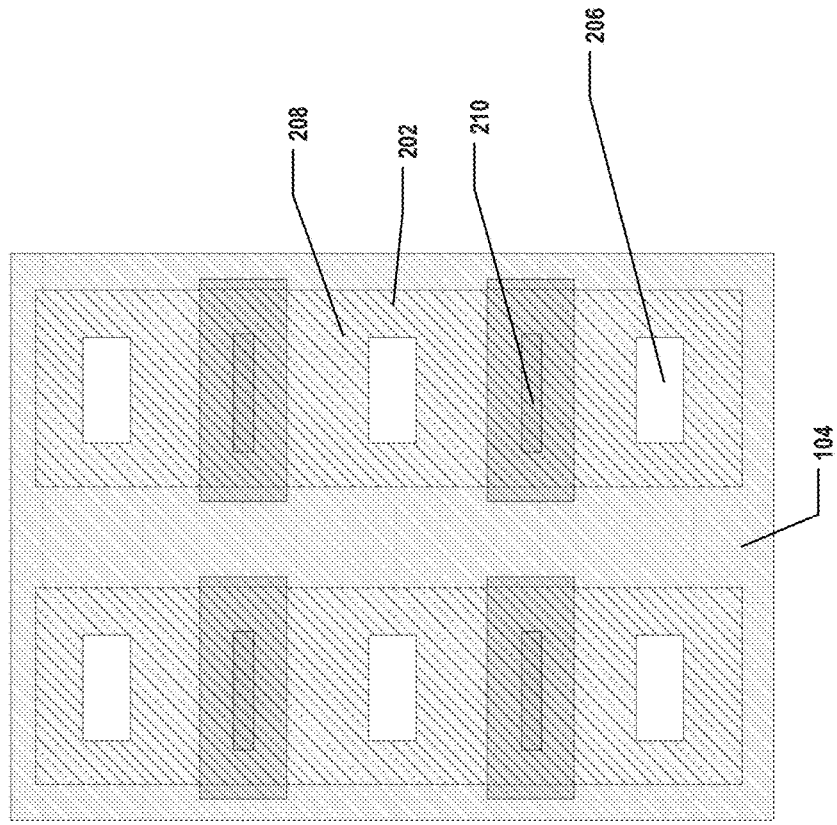
FIG. 3 illustrates a plan view of an exemplary transistor, according to some aspects of the present disclosure.

FIG. 3 illustrates a plan view of transistor 200, according to some aspects of the present disclosure. As shown in FIG. 3, gate dielectric layer 208 may be formed under gate 210 and further consecutively extend along the x-direction above doped region 202. Conductive pad 206 may be exposed from gate dielectric layer 208 and surrounded by gate dielectric layer 208.

FIGS. 4-12 illustrate cross-sections of transistor 200 at different stages of a manufacturing process, according to some aspects of the present disclosure. FIG. 13 illustrates a flowchart of an exemplary method 300 for forming transistor 200, according to some aspects of the present disclosure. For the purpose of better describing the present disclosure, the cross-sections of transistor 200 in FIGS. 4-12 and method 300 in FIG. 13 will be discussed together. It is understood that the operations shown in method 300 are not exhaustive and that other operations may be performed as well before, after, or between any of the illustrated operations. Further, some of the operations may be performed simultaneously, or in a different order than shown in FIGS. 4-12 and FIG. 13.

Figure 4:
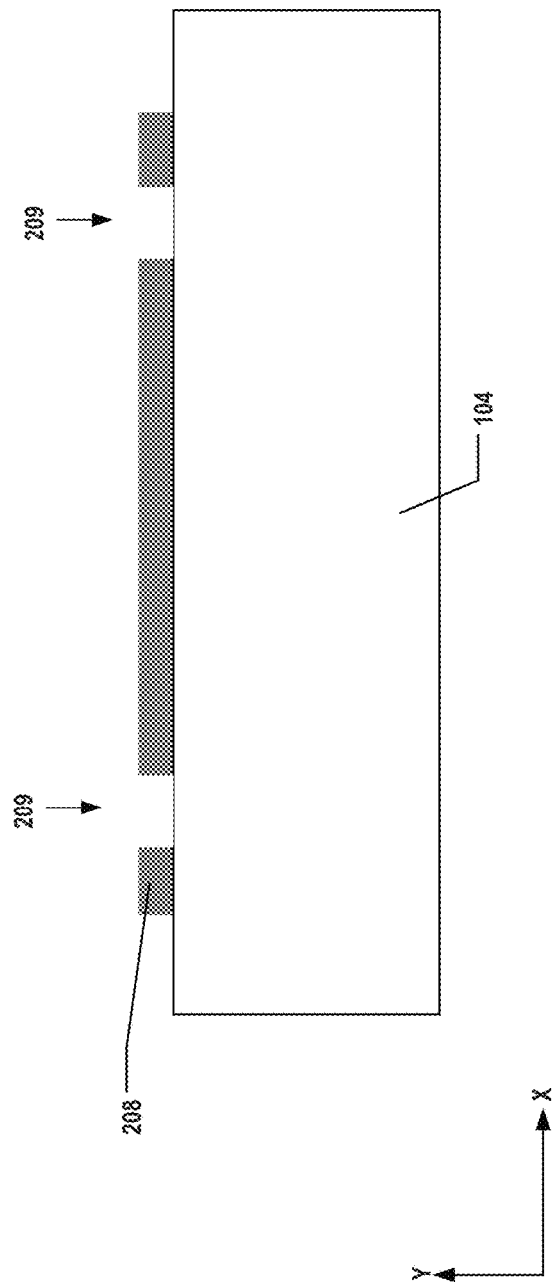
FIGS. 4-12 illustrate cross-sections of an exemplary transistor at different stages of a manufacturing process, according to some aspects of the present disclosure.

As shown in FIG. 4 and operation 302 in FIG. 13, substrate 104 is provided and gate dielectric layer 208 is formed on substrate 104. In some implementations, gate dielectric layer 208 may be formed by one or more thin film deposition processes including, but not limited to, chemical vapor deposition (CVD), physical vapor deposition (PVD), atomic layer deposition (ALD), or any combination thereof.

Then, as shown in FIG. 4 and operation 304 in FIG. 13, openings 209 are formed in gate dielectric layer 208 exposing substrate 104. In some implementations, openings 209 may be formed by dry etch, wet etch, or other suitable processes. Openings 209 is used to define the location of doped region 202, source/drain 204, and conductive pad 206 in later processes.

Figure 5:
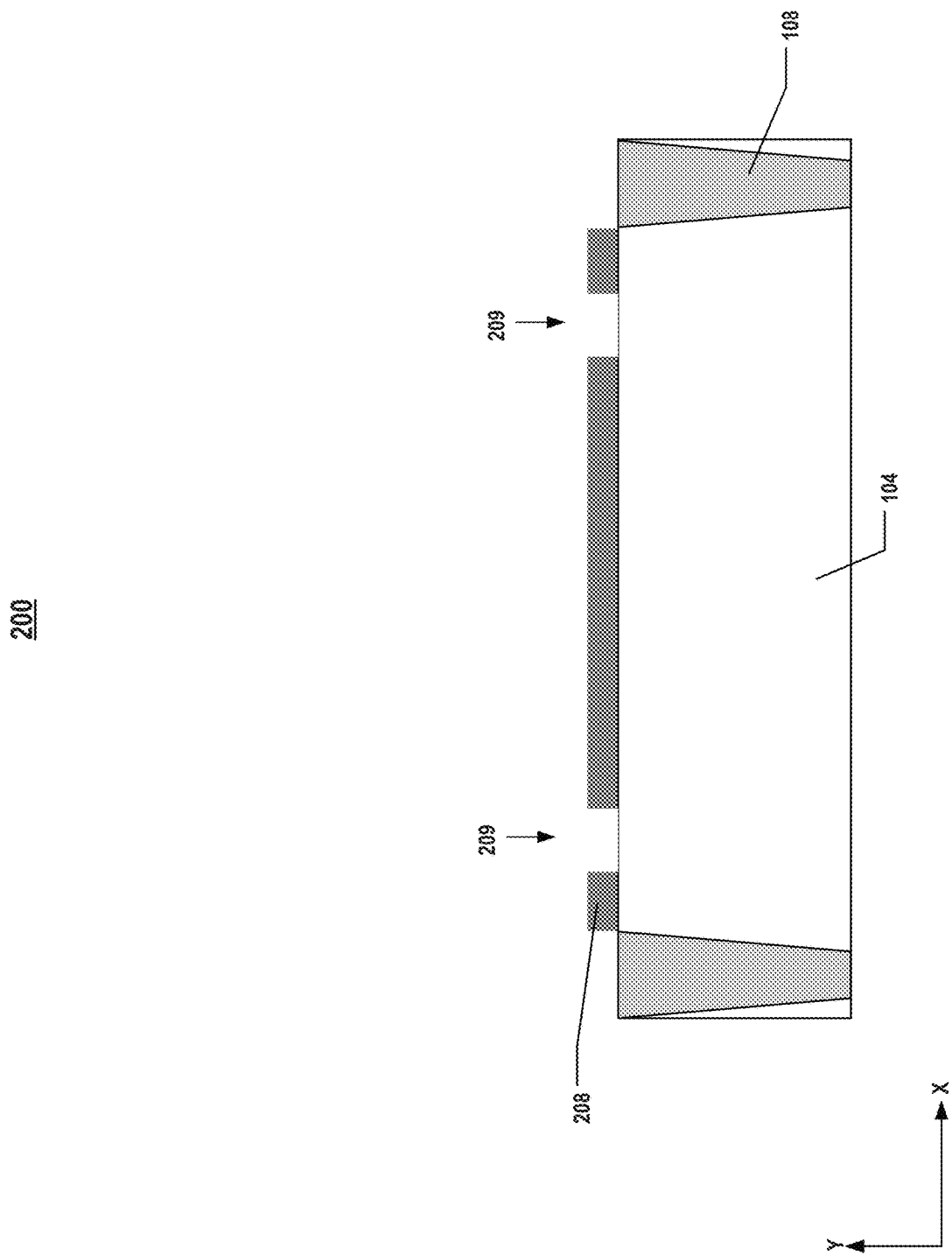

As shown in FIG. 5, isolation regions 108 is formed in substrate 104, and isolation regions 108 is used to isolate adjacent transistors from each other and define the active region of each transistor. In some implementations, isolation regions 108 may be formed by etch operation, such as dry etch, wet etch, or any suitable processes, and deposition operation, such as CVD, PVD, ALD, or other suitable processes. In some implementations, isolation regions 108 may be formed by suitable insulating dielectric materials. In some implementations, isolation regions 108 may be formed by silicon oxide (SiOx).

Figure 6:
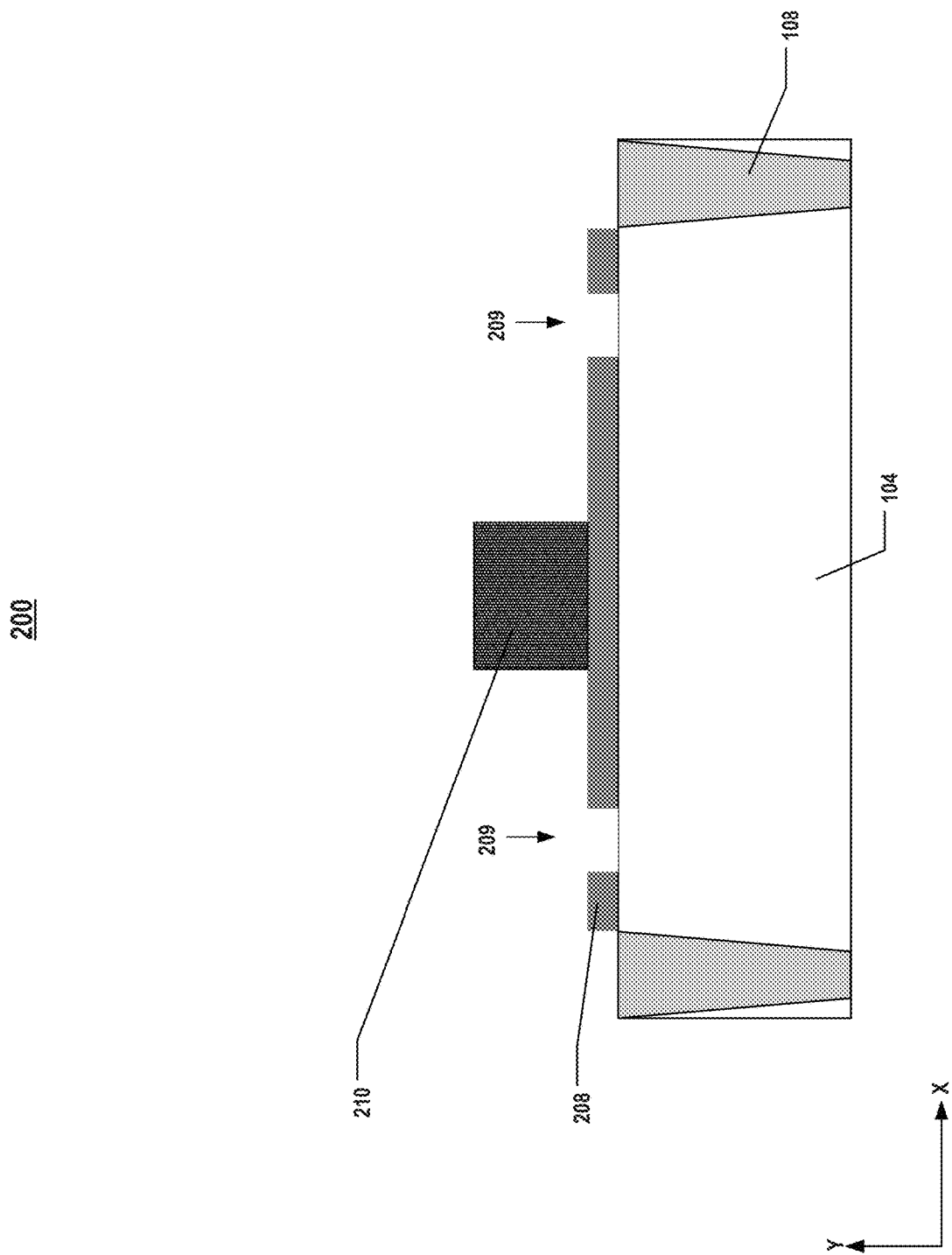

As shown in FIG. 6 and operation 306 in FIG. 13, a gate structure is formed on gate dielectric layer 208. In some implementations, the gate structure may include gate 210 and spacer 212. As shown in FIG. 6, gate 210 is first formed on gate dielectric layer 208 between two openings 209. In some implementations, gate 210 may include a gate poly. In some implementations, gate 210 may further include a gate hard mask on the gate poly. In some implementations, gate 210 may be formed by a "gate first" scheme, where gate 210 is disposed and patterned prior to source/drain formation. In some implementations, gate 210 may be formed by a "replacement" scheme, where a sacrificial gate stack can be formed first and then replaced by gate 210 after source/drain formation.

Figure 7:
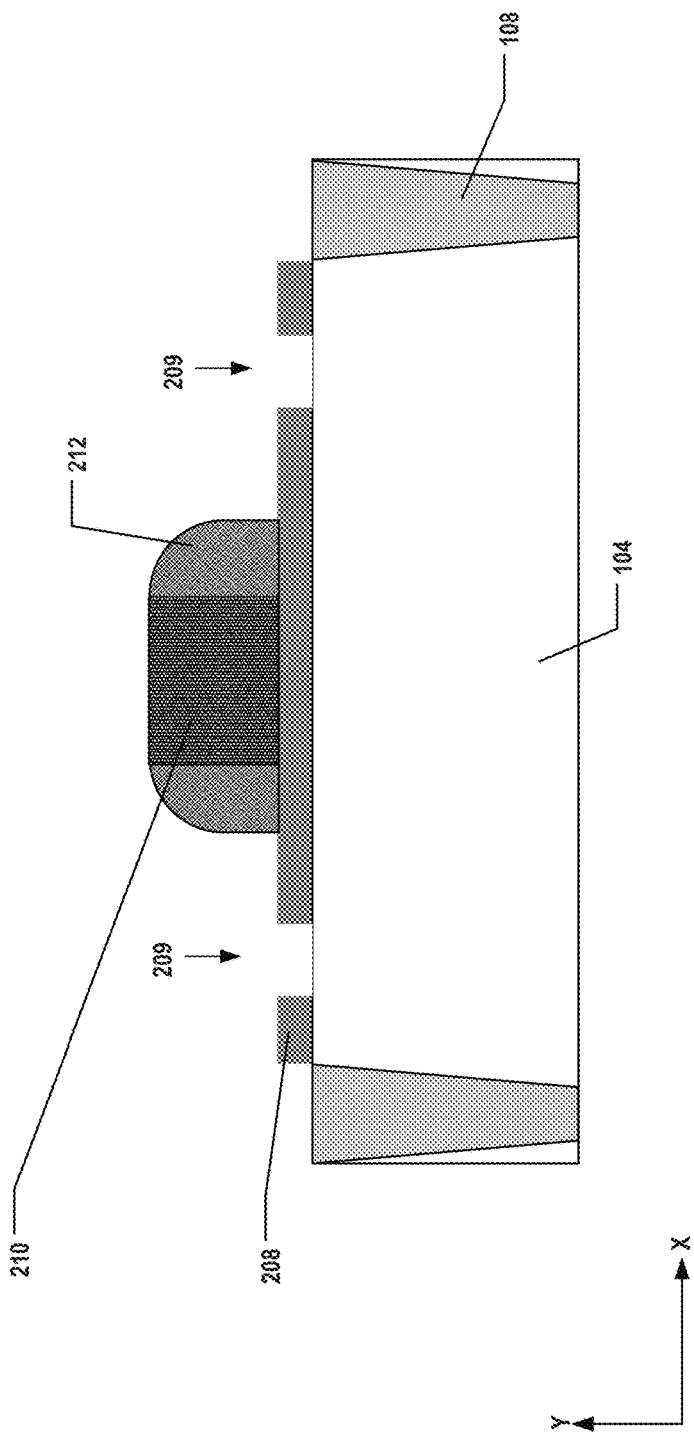

As shown in FIG. 7, spacer 212 may be formed on sides of gate 210. In some implementations, spacer 212 may be formed on sides and top of gate 210. In some implementations, spacer 212 may be formed through disposing an insulating material on gate 210 and then performing anisotropic etching. In some implementations, spacer 212 may include silicon oxide, silicon nitride, silicon oxyntiride, tetraethylorthosilicate (TEOS), low-temperature oxide (LTO), high-temperature oxide (HTO), or any suitable insulator.

Figure 8:
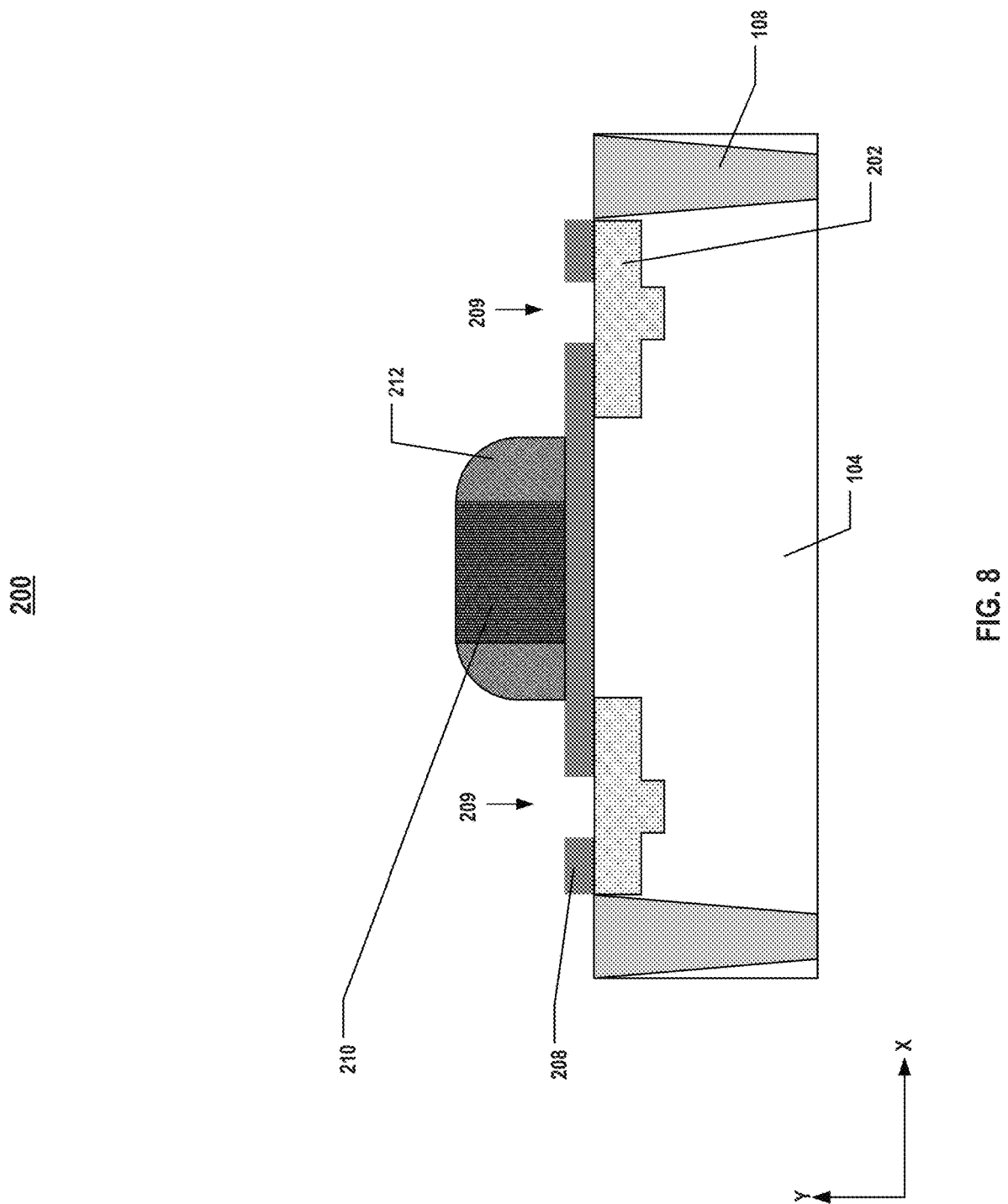
Figure 9:
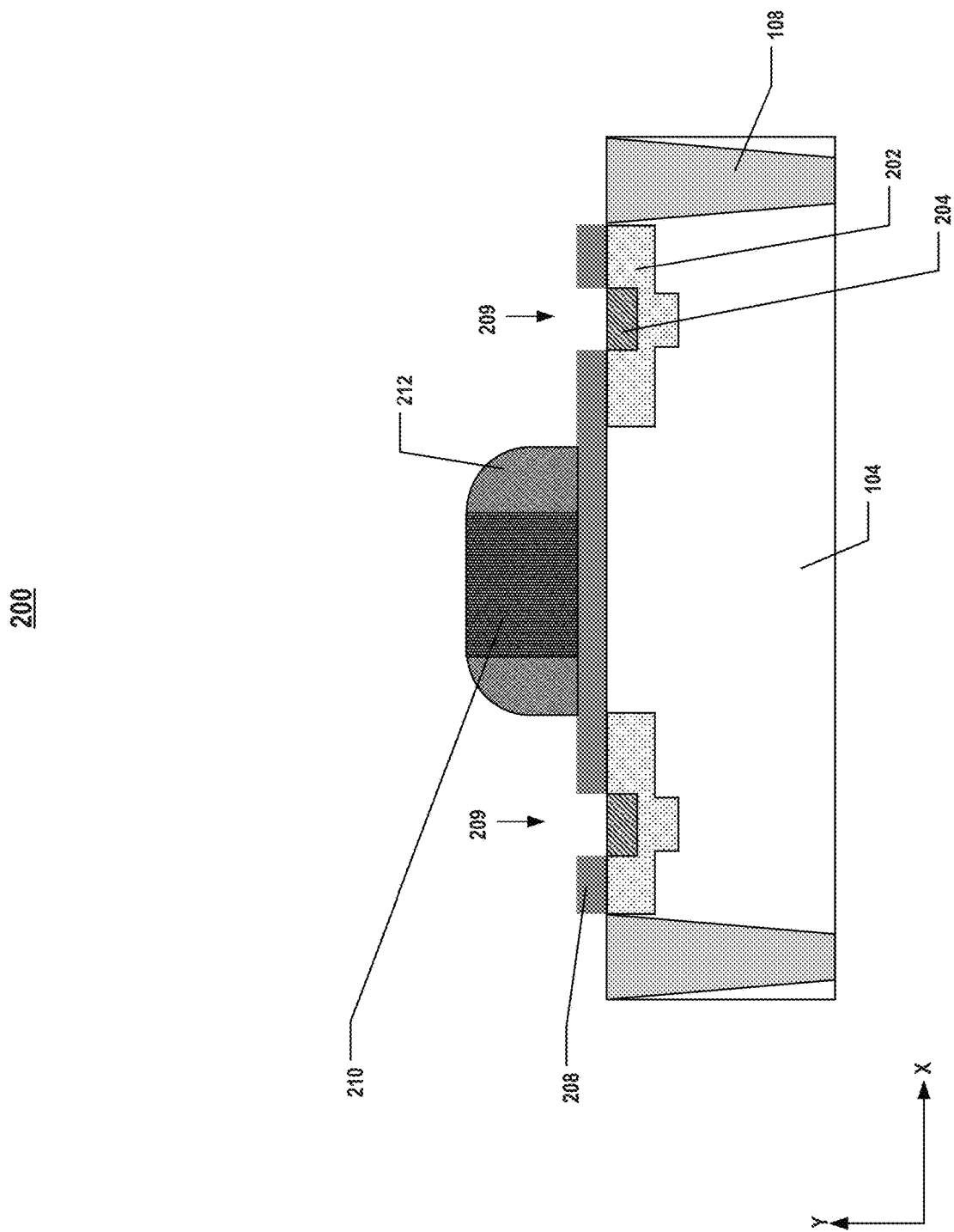

As shown in FIG. 8 and operation 308 in FIG. 13, a first implantation operation is performed to form doped region 202 in substrate 104. Then, as shown in FIG. 9 and operation 310 in FIG. 13, a second implantation operation is performed to form source/drain 204 in doped region 202. In some implementations, doped region 202 is formed between gate 210 and source/drain 204 for reducing electric field when source/drain 204 is applied with high voltage. In some implementations, the first implantation operation may be performed around openings 209, and therefore lightly doped region 202 is formed in substrate 104 around openings 209, as shown in FIG. 8. In some implementations, doped region 202 is formed in substrate 104 between isolation region 108 and spacer 212. In some implementations, doped region 202 is formed in substrate 104 between isolation region 108 and gate 210. In some implementations, doped region 202 may further extend under a portion of gate 210.

In some implementations, when transistor 200 is an NMOS transistor, a p-type channel region may be formed below gate dielectric layer 208 between doped regions 202. Doped regions 202, for example, n-type lightly doped drain regions (LDD), and source/drain 204, for example, n-type source/drain regions, are formed on each side of the p-type channel region. Doped regions 202 are formed so as to be lower in impurity concentration than source/drain 204.

In some implementations, when transistor 200 is a PMOS transistor, an n-type channel region may be formed below gate dielectric layer 208 between doped regions 202. Doped regions 202, for example, p-type LDD, and source/drain 204, for example, p-type source/drain regions, are formed on each side of the n-type channel region. Doped regions 202 are formed so as to be lower in impurity concentration than source/drain 204.

Figure 10:
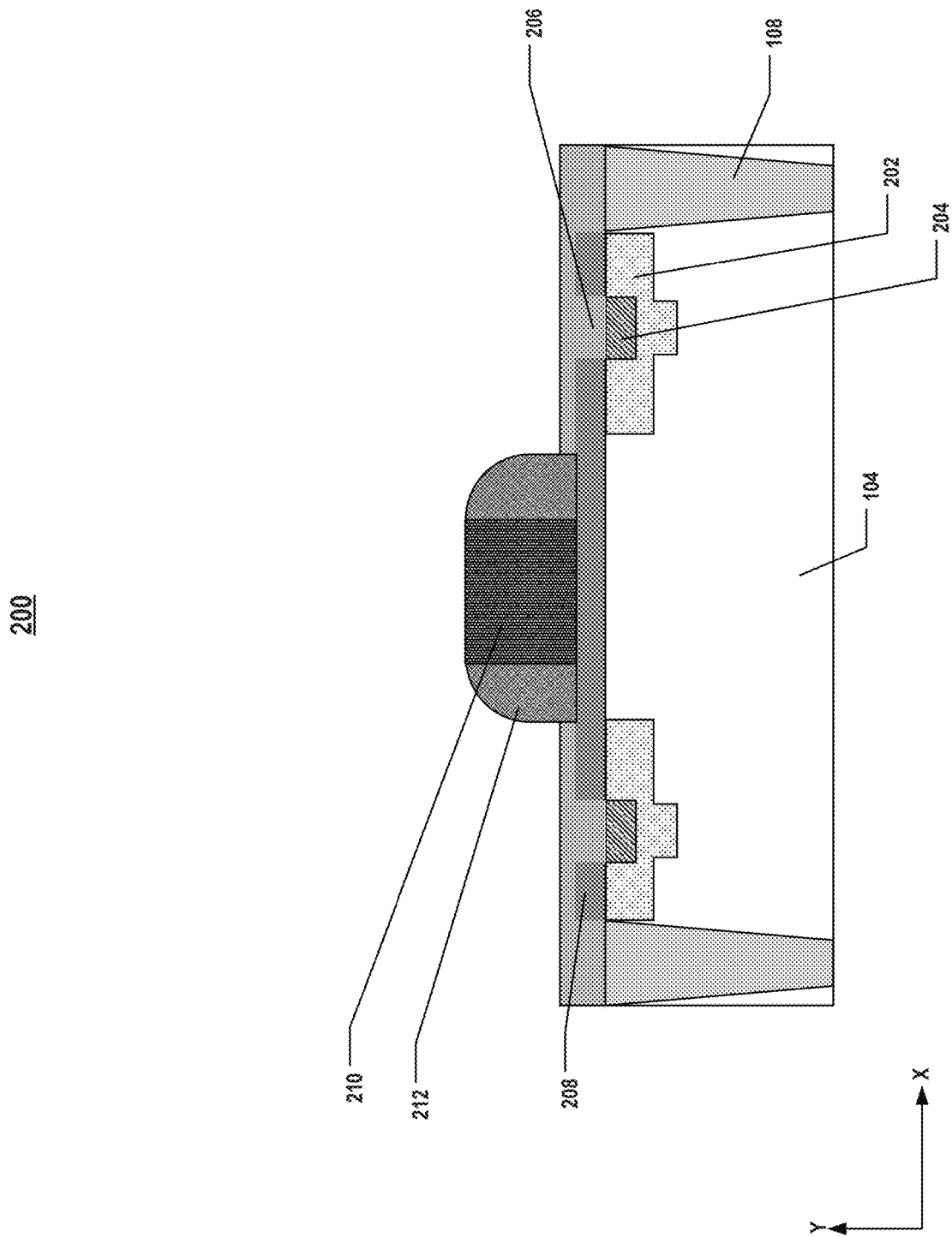
Figure 11:
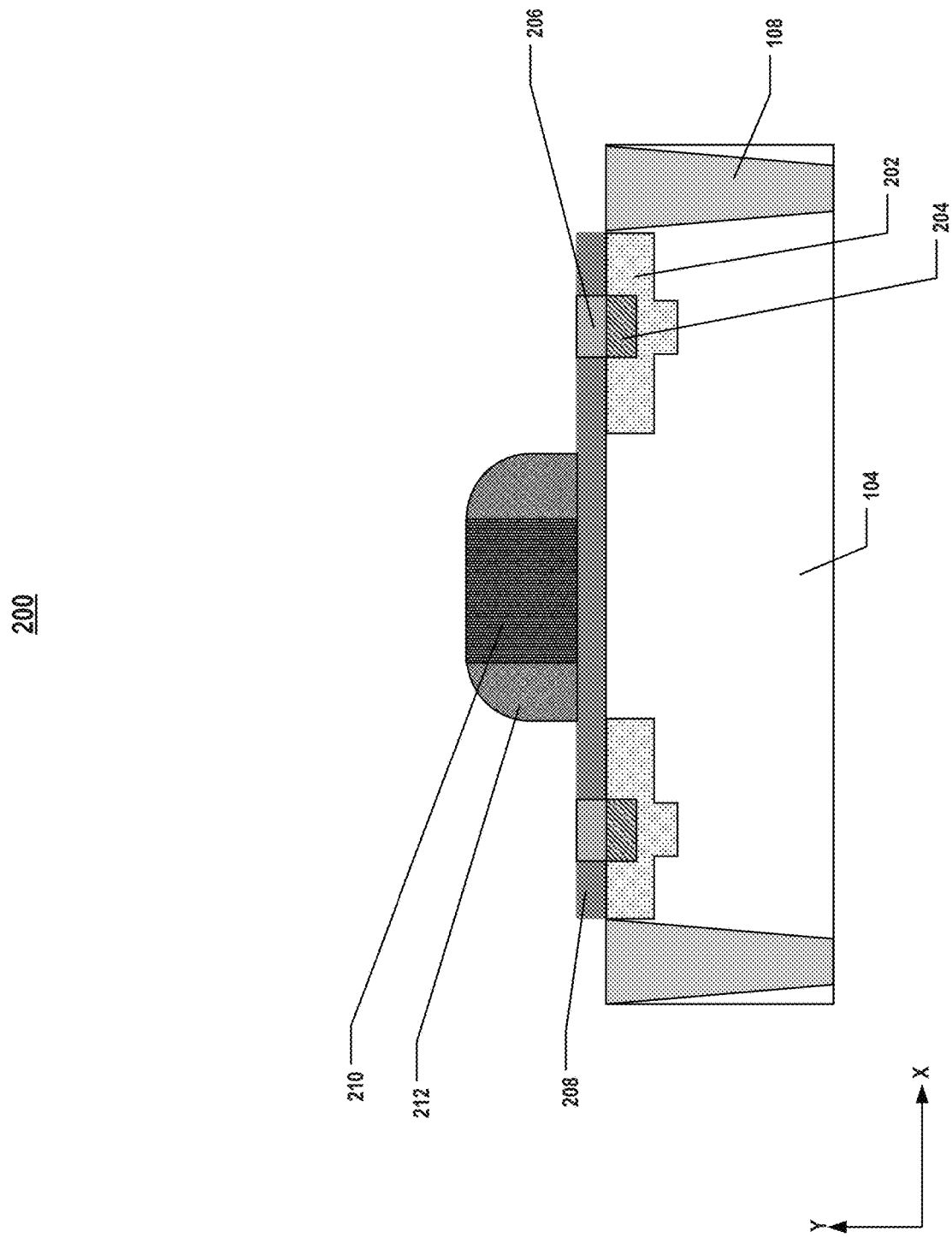

As shown in FIGS. 10-11 and operation 312 in FIG. 13, conductive pad 206 is formed on source/drain 204 in openings 209. As shown in FIG. 10, conductive pad 206 is first deposited on gate dielectric layer 208 and isolation region 108 covering opening 209. Then, as shown in FIG. 11, portions of conductive pad 206 above gate dielectric layer 208 and isolation region 108 are removed, and conductive pad 206 formed in openings 209 remains. In some implementations, conductive pad 206 may be formed by forming a metal layer and a poly-crystalline semiconductor and applying a thermal annealing process on the deposited metal layer and the poly-crystalline semiconductor layer to form conductive pad 206.

Figure 12:
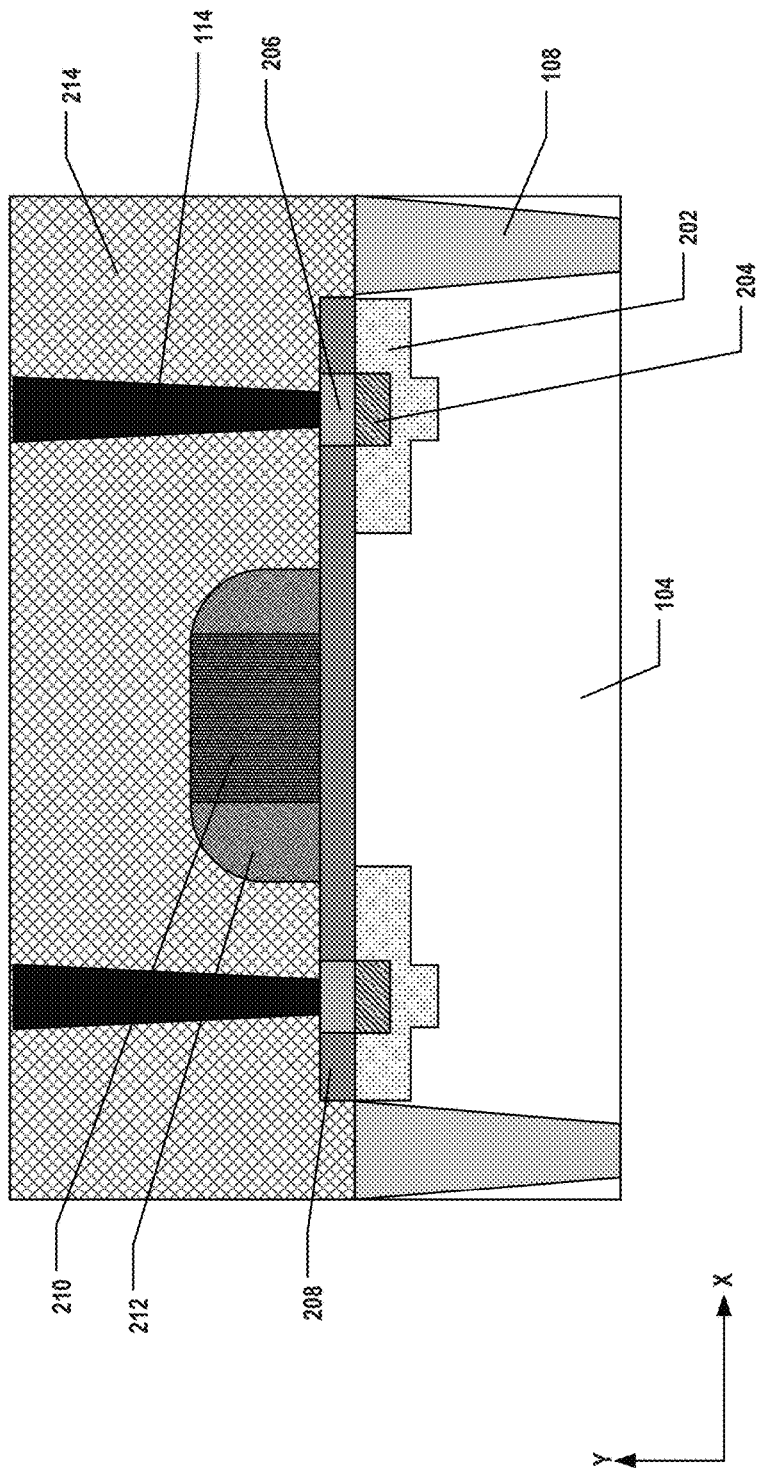
Figure 13:
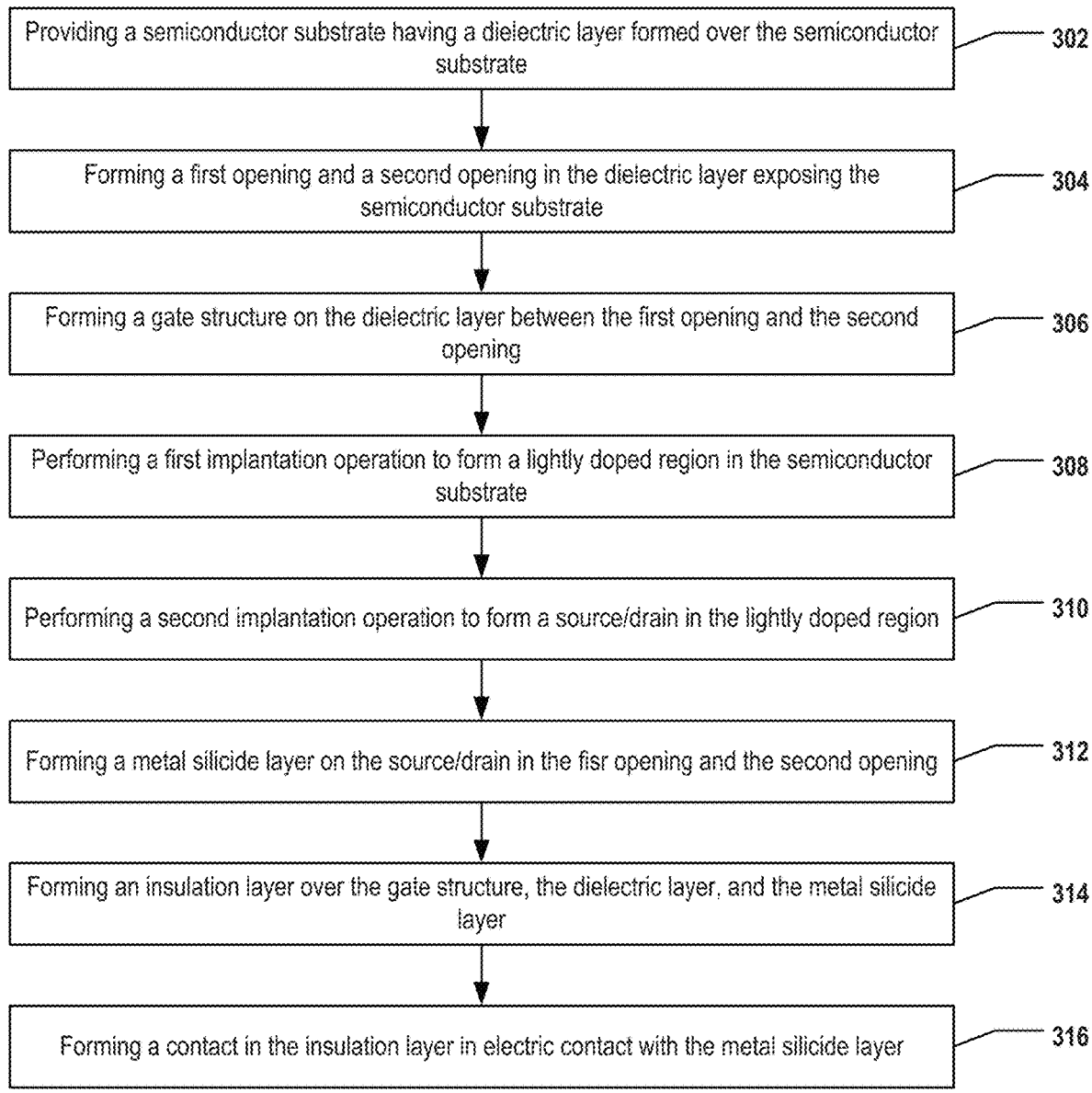
FIG. 13 illustrates a flowchart of an exemplary method for forming a transistor, according to some aspects of the present disclosure.

As shown in FIG. 12 and operation 314 in FIG. 13, insulation layer 214 is formed over isolation regions 108, gate dielectric layer 208, conductive pad 206, spacer 212, and gate 210. In some implementations, insulation layer 214 may include dielectric materials including, but not limited to, silicon oxide, silicon nitride, silicon oxynitride, low dielectric constant (low-k) dielectrics, or any combination thereof. In some implementations, insulation layer 214 may be formed by CVD, PVD, ALD, or any suitable process. Then, as shown in FIG. 12 and operation 316 in FIG. 13, via contact 114 is formed in insulation layer 214 in electric contact with conductive pad 206.

By disposing conductive pad 206 between via contact 114 and source/drain 204, the contact resistance between via contact 114 and source/drain 204 may be lowered. In some implementations, conductive pad 206 includes nickel silicon.

By using gate dielectric layer 208 to form openings 209, and depositing conductive pad 206 in openings 209, the metal silicide blocking layer will not be needed in the fabrication processes. Hence, the process flow of forming transistor 200 can be simplified, and the fabrication cost can also be reduced.

Figure 14:
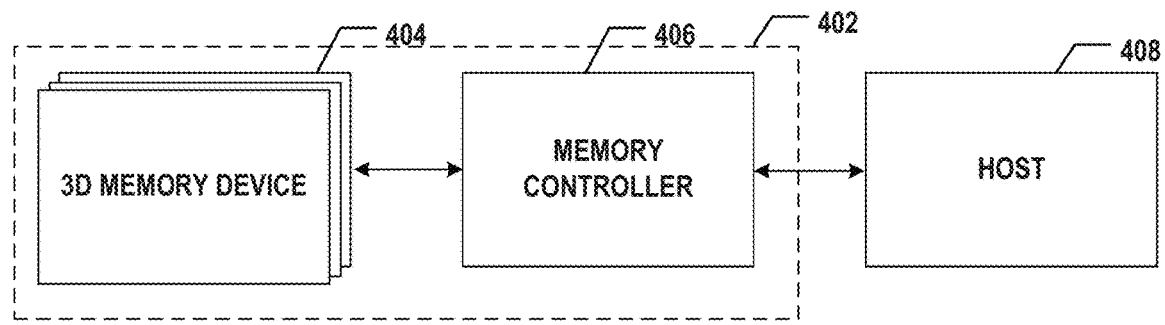
FIG. 14 illustrates a block diagram of an exemplary system having a memory device, according to some aspects of the present disclosure.

FIG. 14 illustrates a block diagram of an exemplary system 400 having a memory device, according to some aspects of the present disclosure. System 400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 14, system 400 can include a host 408 and a memory system 402 having one or more memory devices 404 and a memory controller 406. Host 408 can be a processor of an electronic device, such as a central processing unit (CPU), or a system-on-chip (SoC), such as an application processor (AP). Host 408 can be configured to send or receive data to or from memory devices 404.

Memory device 404 can be any memory device disclosed in the present disclosure. As disclosed above in detail, memory device 404, such as a NAND Flash memory device, may have a controlled and predefined discharge current in the discharge operation of discharging the bit lines. Memory controller 406 is coupled to memory device 404 and host 408 and is configured to control memory device 404, according to some implementations. Memory controller 406 can manage the data stored in memory device 404 and communicate with host 408. For example, memory controller 406 may be coupled to memory device 404, such as 3D memory device 100 described above, and memory controller 406 may be configured to control the operations of memory array device 150 through the peripheral device. By forming the structure according to the present disclosure, the manufacturing process of 3D memory device 100 may be further simplified, and the manufacturing process of system 400 may be improved as well.

In some implementations, memory controller 406 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 406 is designed for operating in a high duty-cycle environment SSDs or embedded multi-media-cards (eMMCs) used as data storage for mobile devices, such as smartphones, tablets, laptop computers, etc., and enterprise storage arrays. Memory controller 406 can be configured to control operations of memory device 404, such as read, erase, and program operations. Memory controller 406 can also be configured to manage various functions with respect to the data stored or to be stored in memory device 404 including, but not limited to bad-block management, garbage collection, logical-to-physical address conversion, wear leveling, etc. In some implementations, memory controller 406 is further configured to process error correction codes (ECCs) with respect to the data read from or written to memory device 404. Any other suitable functions may be performed by memory controller 406 as well, for example, formatting memory device 404. Memory controller 406 can communicate with an external device (e.g., host 408) according to a particular communication protocol. For example, memory controller 406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 15A, 15B:
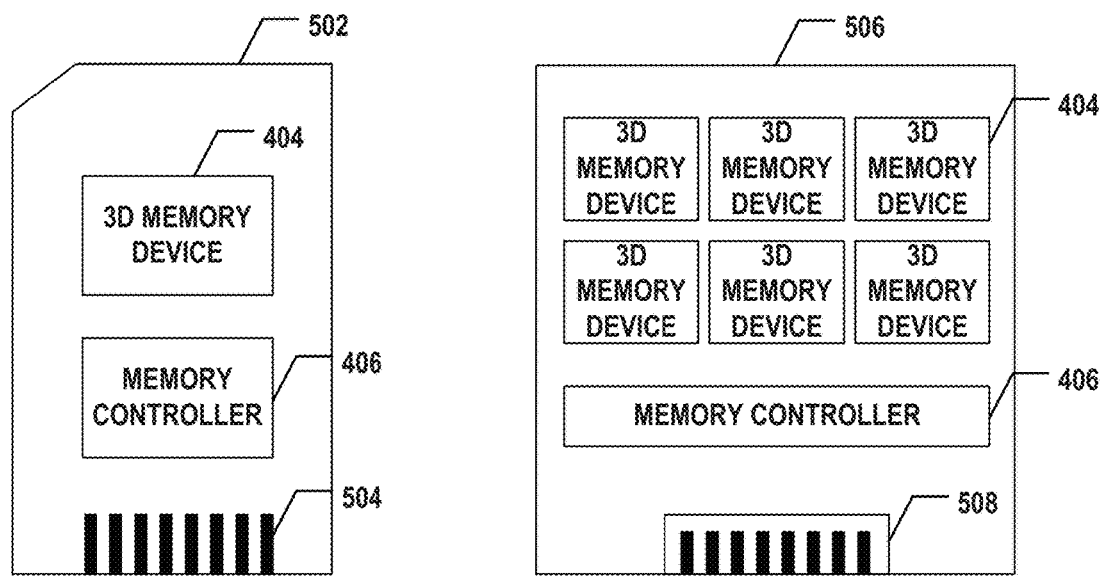
FIG. 15A illustrates a diagram of an exemplary memory card having a memory device, according to some aspects of the present disclosure.
FIG. 15B illustrates a diagram of an exemplary solid-state drive (SSD) having a memory device, according to some aspects of the present disclosure.

Memory controller 406 and one or more memory devices 404 can be integrated into various types of storage devices, for example, be included in the same package, such as a universal Flash storage (UFS) package or an eMMC package. That is, memory system 402 can be implemented and packaged into different types of end electronic products. In one example as shown in FIG. 15A, memory controller 406 and a single memory device 404 may be integrated into a memory card 502. Memory card 502 can include a PC card (PCMCIA, personal computer memory card international association), a CF card, a smart media (SM) card, a memory stick, a multimedia card (MMC, RS-MMC, MMCmicro), an SD card (SD, mini SD, microSD, SDHC), a UFS, etc. Memory card 502 can further include a memory card connector 504 coupling memory card 502 with a host (e.g., host 408 in FIG. 14). In another example as shown in FIG. 15B, memory controller 406 and multiple memory devices 404 may be integrated into an SSD 506. SSD 506 can further include an SSD connector 508 coupling SSD 506 with a host (e.g., host 408 in FIG. 18). In some implementations, the storage capacity and/or the operation speed of SSD 506 is greater than those of memory card 502.

According to one aspect of the present disclosure, a semiconductor device is disclosed. The semiconductor device includes a semiconductor substrate, a doped region formed in the semiconductor substrate, a source/drain formed in the doped region, a conductive pad formed on the source/drain, a gate dielectric layer disposed over the semiconductor substrate and the doped region exposing the conductive pad, a gate formed on the gate dielectric layer, an insulation layer formed over the gate, the gate dielectric layer, and the conductive pad, and a contact formed in the insulation layer in electric contact with the conductive pad.

In some implementations, the conductive pad includes nickel silicide. In some implementations, the gate dielectric layer includes gate oxide layer.

In some implementations, the gate dielectric layer consecutively extends above the doped region and under the gate.

In some implementations, the conductive pad is surrounded by the gate dielectric layer. In some implementations, the conductive pad is in direct contact with the gate dielectric layer.

In some implementations, the insulation layer is in contact with the gate dielectric layer.

According to another aspect of the present disclosure, a 3D memory device is disclosed. The 3D memory device includes a peripheral device and a memory stack disposed above the peripheral device. The peripheral device includes a plurality of transistors. Each transistor includes a semiconductor substrate, a doped region formed in the semiconductor substrate, a source/drain formed in the doped region, a conductive pad formed on the source/drain, a gate dielectric layer disposed over the semiconductor substrate and the doped region exposing the conductive pad, a gate formed on the gate dielectric layer, an insulation layer formed over the gate, the gate dielectric layer, and the conductive pad, and a contact formed in the insulation layer in electric contact with the conductive pad.

In some implementations, the conductive pad includes nickel silicide. In some implementations, the gate dielectric layer includes gate oxide layer.

In some implementations, the gate dielectric layer consecutively extends above the doped region and under the gate.

In some implementations, the conductive pad is surrounded by the gate dielectric layer. In some implementations, the conductive pad is in direct contact with the gate dielectric layer.

In some implementations, the insulation layer is in contact with the gate dielectric layer.

According to still another aspect of the present disclosure, a system is disclosed. The system includes a 3D memory device configured to store data, and a memory controller coupled to the 3D memory device and is configured to control operations of the 3D memory device. The 3D memory device includes a peripheral device and a memory stack disposed above the peripheral device. The peripheral device includes a plurality of transistors. Each transistor includes a semiconductor substrate, a doped region formed in the semiconductor substrate, a source/drain formed in the doped region, a conductive pad formed on the source/drain, a gate dielectric layer disposed over the semiconductor substrate and the doped region exposing the conductive pad, a gate formed on the gate dielectric layer, an insulation layer formed over the gate, the gate dielectric layer, and the conductive pad, and a contact formed in the insulation layer in electric contact with the conductive pad.

According to yet another aspect of the present disclosure, a method for forming a semiconductor device is disclosed. A semiconductor substrate having a dielectric layer formed over the semiconductor substrate is provided. A first opening and a second opening are formed in the dielectric layer exposing the semiconductor substrate. A gate structure is formed on the dielectric layer between the first opening and the second opening. A first implantation operation is performed to form a doped region in the semiconductor substrate. A second implantation operation is performed to form a source/drain in the doped region. A conductive pad is formed on the source/drain in the first opening and the second opening. An insulation layer is formed over the gate structure, the dielectric layer, and the conductive pad. A contact is formed in the insulation layer in electric contact with the conductive pad.

In some implementations, a plurality of isolation structures are formed in the semiconductor substrate to define an active region of the transistor. In some implementations, a gate conductive layer is formed on the dielectric layer between the first opening and the second opening. A spacer is formed on sides of the gate conductive layer.

In some implementations, the first implantation operation is performed to form the doped region in the semiconductor substrate under the dielectric layer around the first opening and the second opening. In some implementations, the second implantation operation is performed to form the source/drain in the doped region under the dielectric layer around the first opening and the second opening.

In some implementations, the conductive pad is deposited over the dielectric layer to fill the first opening and the second opening. Portions of the conductive pad above the dielectric layer are removed. In some implementations, the conductive pad comprises nickel silicide.

According to yet another aspect of the present disclosure, a method for forming a 3D memory device is disclosed. A peripheral device is formed on a semiconductor substrate. The formation of the peripheral device includes forming a dielectric layer over the semiconductor substrate, forming a first opening and a second opening in the dielectric layer exposing the semiconductor substrate, forming a gate structure on the dielectric layer between the first opening and the second opening, performing a first implantation operation to form a doped region in the semiconductor substrate, performing a second implantation operation to form a source/drain in the doped region, forming a conductive pad on the source/drain in the first opening and the second opening, forming an insulation layer over the gate structure, the dielectric layer, and the conductive pad, and forming a contact in the insulation layer in electric contact with the conductive pad. A memory stack is formed on the peripheral device.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A semiconductor device, comprising:
   a semiconductor substrate;
   a doped region formed in the semiconductor substrate;
   a first source/drain and a second source/drain formed in the doped region;
   a first conductive pad formed on the first source/drain and a second conductive pad formed on the second source/drain;
   a gate dielectric layer disposed over the semiconductor substrate and the doped region exposing the first conductive pad and the second conductive pad;
   a gate formed on the gate dielectric layer;
   an insulation layer formed over the gate, the gate dielectric layer, the first conductive pad, and the second conductive pad; and
   a first contact formed in the insulation layer in electric contact with the first conductive pad and a second contact formed in the insulation layer in electric contact with the second conductive pad,
   wherein a first entire area of the first conductive pad is fully within a second area of the first source/drain, and a third entire area of the second conductive pad is fully within a fourth area of the second source/drain, and wherein the first conductive pad fully overlaps the first source/drain, and the second conductive pad fully overlaps the second source/drain.

2. The semiconductor device of claim 1, wherein the first conductive pad comprises a metal silicide layer.

3. The semiconductor device of claim 2, wherein the metal silicide layer comprises nickel silicide.

4. The semiconductor device of claim 1, wherein the gate dielectric layer comprises gate oxide layer.

5. The semiconductor device of claim 1, wherein the gate dielectric layer consecutively extends above the doped region and under the gate.

6. The semiconductor device of claim 1, wherein the first conductive pad is surrounded by the gate dielectric layer.

7. The semiconductor device of claim 6, wherein the first conductive pad is in direct contact with the gate dielectric layer.

8. The semiconductor device of claim 1, wherein the insulation layer is in contact with the gate dielectric layer.

9. A three-dimensional (3D) memory device, comprising:
   a peripheral device, comprising a plurality of transistors, each transistor comprising:
      a semiconductor substrate;
      a doped region formed in the semiconductor substrate;
      a first source/drain and a second source/drain formed in the doped region;
      a first conductive pad formed on the first source/drain and a second conductive pad formed on the second source/drain;
      a gate dielectric layer disposed over the semiconductor substrate and the doped region exposing the first conductive pad and the second conductive pad;
      a gate formed on the gate dielectric layer;
      an insulation layer formed over the gate, the gate dielectric layer, the first conductive pad, and the second conductive pad; and
      a first contact formed in the insulation layer in electric contact with the first conductive pad and a second contact formed in the insulation layer in electric contact with the second conductive pad,
      wherein a first entire area of the first conductive pad is fully within a second area of the first source/drain, and a third entire area of the second conductive pad is fully within a fourth area of the second source/drain, and
      wherein the first conductive pad fully overlaps the first source/drain, and the second conductive pad fully overlaps the second source/drain; and
   a memory stack disposed above the peripheral device.

10. The 3D memory device of claim 9, wherein the first conductive pad comprises nickel silicide.

11. The 3D memory device of claim 9, wherein the gate dielectric layer comprises a gate oxide layer.

12. The 3D memory device of claim 9, wherein the gate dielectric layer consecutively extends above the doped region and under the gate.

13. The 3D memory device of claim 9, wherein the first conductive pad is surrounded by the gate dielectric layer.

14. The 3D memory device of claim 13, wherein the first conductive pad is in direct contact with the gate dielectric layer.

* * * * *